(12) United States Patent
Park et al.

(10) Patent No.: US 8,855,237 B2
(45) Date of Patent: *Oct. 7, 2014

(54) DIGITAL BROADCASTING TRANSMISSION/RECEPTION SYSTEM HAVING IMPROVED RECEIVING PERFORMANCE AND SIGNAL PROCESSING METHOD THEREOF

(75) Inventors: Eui-jun Park, Seoul (KR); Yong-deok Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 637 days.

This patent is subject to a terminal disclaimer.

(21) Appl. No.: 12/261,490

(22) Filed: Oct. 30, 2008

(65) Prior Publication Data

US 2009/0122915 A1 May 14, 2009

Related U.S. Application Data

(63) Continuation of application No. 11/632,134, filed as application No. PCT/KR2005/002272 on Jul. 15, 2005, now Pat. No. 7,844,012.

(30) Foreign Application Priority Data

Jul. 15, 2004 (KR) .................................. 2004-55192

(51) Int. Cl.
*H03K 9/00* (2006.01)
*H04L 5/12* (2006.01)
(Continued)

(52) U.S. Cl.
CPC .......... *H03M 13/256* (2013.01); *H03M 13/253* (2013.01); *H04L 1/0045* (2013.01);
(Continued)

(58) Field of Classification Search
USPC ......... 375/229–236, 262, 265, 259, 285, 316, 375/324, 340, 341, 295
See application file for complete search history.

(56) References Cited

U.S. PATENT DOCUMENTS 5,616,063 A 4/1997 Okumura et al.
5,679,059 A 10/1997 Nishi et al.
(Continued)

FOREIGN PATENT DOCUMENTS

CA 2 404 404 3/2003
CN 1346212 4/2002
(Continued)

OTHER PUBLICATIONS

PCT International Preliminary Report on Patentability dated Jan. 16, 2007 issued in PCT/KR2005/002272.
(Continued)

*Primary Examiner* — Sam K Ahn
*Assistant Examiner* — Linda Wong
(74) *Attorney, Agent, or Firm* — Sughrue Mion, PLLC

(57) ABSTRACT

A digital broadcasting transmission/reception system having improved receiving performance and signal processing method thereof. A digital broadcasting transmitter according to the present invention includes a data pre-processor which processed robust data and generates robust data packet of predetermined format, a TS stream generator which combines robust data packet with a normal data packet to generate a TS stream of a predetermined format, a randomizer which randomizes the TS stream output from the TS stream generator, a convolution encoder which performs convolution encoding with respect to the robust data of the data output from the randomizer, and a RS encoder which performs RS encoding with respect to the data output from the convolution g encoder. Accordingly, digital broadcasting receiving performance can be improved in a poor multipath channel, while maintaining compatibility with existing transmission/reception system.

11 Claims, 8 Drawing Sheets

(51) Int. Cl.
| | |
|---|---|
| *H03M 13/25* | (2006.01) |
| *H04L 1/00* | (2006.01) |
| *H04L 27/02* | (2006.01) |
| *H04N 21/4385* | (2011.01) |
| *H03M 13/35* | (2006.01) |
| *H04N 21/2383* | (2011.01) |
| *H04N 21/2389* | (2011.01) |
| *H04N 21/438* | (2011.01) |
| *H03M 13/29* | (2006.01) |
| *H04N 5/44* | (2011.01) |
| *H04N 5/455* | (2006.01) |

(52) U.S. Cl.
CPC .............. *H04L 1/0066* (2013.01); *H04L 1/007* (2013.01); *H04L 1/0065* (2013.01); *H04L 27/02* (2013.01); *H04N 5/4401* (2013.01); *H04N 21/4385* (2013.01); *H03M 13/356* (2013.01); *H04L 1/0071* (2013.01); *H04N 21/2383* (2013.01); *H04L 1/0057* (2013.01); *H04L 1/005* (2013.01); *H04N 21/2389* (2013.01); *H04N 21/4382* (2013.01); *H04N 5/455* (2013.01); *H04L 1/0054* (2013.01); *H03M 13/2936* (2013.01); *H04L 1/0068* (2013.01); *H03M 13/2948* (2013.01); *H04L 1/0059* (2013.01); *H04L 1/0083* (2013.01); *H04L 1/0041* (2013.01)
USPC ............ 375/316; 375/229; 375/265; 375/262

(56) References Cited

U.S. PATENT DOCUMENTS

| | | | | |
|---|---|---|---|---|
| 5,718,483 | A | | 2/1998 | Yamaguchi et al. |
| 6,947,487 | B2 | * | 9/2005 | Choi et al. ............... 375/240.25 |
| 6,988,233 | B2 | | 1/2006 | Kanai et al. |
| 7,088,793 | B1 | * | 8/2006 | Mickelson et al. ........... 375/341 |
| 7,206,352 | B2 | * | 4/2007 | Birru et al. ..................... 375/265 |
| 7,620,881 | B2 | * | 11/2009 | Nieto ............................ 714/794 |
| 2001/0055342 | A1 | * | 12/2001 | Fimoff ..................... 375/240.26 |
| 2002/0037056 | A1 | | 3/2002 | Choi et al. |
| 2002/0041608 | A1 | | 4/2002 | Choi et al. |
| 2002/0056065 | A1 | | 5/2002 | Jung et al. |
| 2002/0172277 | A1 | * | 11/2002 | Choi et al. ............... 375/240.01 |
| 2002/0194570 | A1 | | 12/2002 | Birru et al. |
| 2003/0009719 | A1 | | 1/2003 | Kanai et al. |
| 2004/0010744 | A1 | | 1/2004 | Chen et al. |
| 2004/0028076 | A1 | | 2/2004 | Strolle et al. |
| 2004/0057535 | A1 | * | 3/2004 | Strolle et al. ................. 375/340 |
| 2004/0101046 | A1 | | 5/2004 | Yang et al. |
| 2004/0105403 | A1 | | 6/2004 | Lin et al. |
| 2004/0196164 | A1 | * | 10/2004 | Jaffe et al. ....................... 341/50 |
| 2005/0111586 | A1 | * | 5/2005 | Kang et al. ................... 375/321 |
| 2006/0168500 | A1 | * | 7/2006 | Whinnett et al. ............. 714/794 |
| 2008/0081575 | A1 | * | 4/2008 | Mathew et al. ............ 455/187.1 |

FOREIGN PATENT DOCUMENTS

| | | |
|---|---|---|
| CN | 1397107 | 2/2003 |
| KR | 1020020093930 | 12/2002 |
| KR | 1020030026236 | 3/2003 |
| WO | WO 02/03678 A2 | 1/2002 |
| WO | WO 02/100026 A1 | 12/2002 |
| WO | 2004/042989 A1 | 5/2004 |
| WO | 2004/043073 | 5/2004 |
| WO | 2006/006833 | 1/2006 |

OTHER PUBLICATIONS

Chinese Office Action issued Jun. 3, 2010 in CN Application No. 200910165469.

Notice of Allowance issued in Korean Patent Application No. 10-2009-0081294 on Sep. 28, 2011.

Yang et al., "A Novel Scheme of Coding and Modulation for Digital Television Terrestrial Broadcasting," The 14th IEEE 2003 International Symposium on Personal, Indoor and Mobile Radio Communication Proceedings, pp. 376-379.

Canadian Office Action issued in Canadian Patent Application No. 2572912 on Jun. 9, 2011.

Korean Notice of Allowance issued Apr. 6, 2012 in Korean Patent Application No. 10-2004-0055192.

Canadian Office Action issued Apr. 13, 2012 in Canadian Patent Application No. 2,677,984.

Canadian Office Action issued Apr. 16, 2012 in Canadian Patent Application No. 2,677,985.

Korean Notice of Allowance issued May 3, 2012 in Korean Patent Application No. 10-2012-0021441.

Canadian Office Action issued May 8, 2012 in Canadian Patent Application No. 2,677,982.

Canadian Office Action issued May 8, 2012 in Canadian Patent Application No. 2,677,969.

Chinese Office Action issued May 18, 2012 in Chinese Patent Application No. 200910167085.1.

Communication dated Jul. 10, 2012 issued by the Canadian Intellectual Property Office in counterpart Canadian Patent Application No. 2,572,912.

Communication, dated Oct. 10, 2013, issued by the Canadian Intellectual Property Office in counterpart Canadian Patent Application No. 2,677,984.

\* cited by examiner

Normal MPEG TS Packet

MPEG TS Packet Containing Adaptation Field

DIGITAL BROADCASTING TRANSMISSION/RECEPTION SYSTEM HAVING IMPROVED RECEIVING PERFORMANCE AND SIGNAL PROCESSING METHOD THEREOF

This application is a continuation of prior application Ser. No. 11/632,134, filed Jan. 11, 2007, now U.S. Pat. No. 7,844,012 in the U.S. Patent and Trademark Office, which claims priority from Korean Patent Application No. 2004-55192, filed on Jul. 15, 2004 in the Korean Intellectual Property Office, and International application PCT/KR05/02272, filed on Jul. 15, 2005, the disclosure of which is incorporated herein in its entirety by reference.

TECHNICAL FIELD

The present invention relates to a digital broadcasting transmission/reception system, and more specifically, to a digital broadcasting transmission/reception system to reinforce a reception performance of a robust stream in a poor channel environment so that a reception performance of a normal stream can be improved together, and a signal processing method thereof.

BACKGROUND ART

The Advanced Television Systems Committee Vestigial Sideband (ATSC VSB) method, a U.S-oriented terrestrial waves digital broadcasting system, is a single carrier method and uses a field sync by 312 segment unit. Accordingly, reception performance is not good in poor channels, especially in a Doppler fading channel.

FIG. 1 is a block diagram of a transmitter/receiver of a general U.S-oriented terrestrial waves digital broadcasting system according to the ATSC digital television (DTV) standards. The digital broadcasting transmitter of FIG. 1 has a randomizer (110) for randomizing an MPEG-2 TS, an Reed-Solomon (RS) encoder (120) of a concatenated coder form for correcting errors generated by channels, an interleaver (130)(B=52, M=4), and a ⅔ rate trellis encoder (140). The encoded data are mapped in 8 level symbol and are inserted with field syncs and segment syncs as shown in FIG. 2. After that, the data are inserted with pilots, VSB-modulated, unconverted into RF and transmitted.

Meanwhile, the digital broadcasting receiver of FIG. 1 lowers the RP signal to baseband, demodulates and equalizes the lowered signal, performs channel decoding, and restores the original signal in a reverse order of the digital broadcasting transmitter. FIG. 2 shows a vestigial sideband (VSB) data frame of the U.S-oriented DTV system. In FIG. 2, one frame consists of two fields and one field has 312 data segments and field sync segment. One segment has segment syncs of four symbols and data symbols of 828 symbols.

As shown in FIG. 1, the digital broadcasting transmitter randomizes the MPEG-2 TS through the randomizer (110). The randomized data are outer-coded through the RS encoder (120) which is an outer coder, and the outer-coded data are dispersed through the interleaver (130). The interleaved data are inner-coded by 12 symbol unit through the trellis encoder (140), and the inner-coded data are mapped in a 8 level symbol and inserted with the field syncs and segment syncs as shown in FIG. 2. Afterwards, the data have DC offset to generate the pilot, and are VSB-modulated, upconverted to a RF signal and transmitted.

Meanwhile, the digital broadcasting receiver of FIG. 1 converts an RF signal received through a channel into a baseband signal through a tuner/IF (not shown). The baseband signal is syncronization-detected and demodulated through a demodulator (210), and distortion by channel multipath is compensated through an equalizer (220). The equalized signal is error-corrected and decoded into symbol data through a trellis decoder (230). The decoded data, which have been dispersed by the interleaver (130) of the transmitter, are rearranged through a deinterleaver (240), and the deinterleaved data are error-corrected through an RS decoder (250). The error-corrected data are derandomized through a derandomizer (260) and output into an MPEG-2 TS.

In the VSB data frame of the U.S-oriented terrestrial waves DTV system of FIG. 2, one segment corresponds to one MPEG-2 packet. In FIG. 2, one frame consists of two fields and one field has 312 data segments and field sync segment. One segment has segment syncs of four symbols and data symbols of 828 symbols. The segment sync and field sync which are sync signals used for synchronization and equalization. The field sync and segment sync are known sequences and used as training data in the equalizer.

The VSB method of the U.S-oriented terrestrial waves digital television system of FIG. 1 is a single carrier system and there is a shortcoming that because error-correcting capacity of the trellis encoder of FIG. 3 is not so strong, energy of a large output is needed to improve a reception performance in a poor channel environment.

DISCLOSURE OF INVENTION

Technical Problem

An aspect of the present invention is to provide a digital broadcasting transmission/reception system to improve a reception performance by combining a normal stream of the existing transmission type in a U.S-oriented terrestrial waves digital television (DTV) system of the VSB method with a robust stream of an improved reception performance in a poor channel environment, and a signal processing method thereof.

Technical Solution

A digital broadcasting transmitter according to the present invention may include a robust data pre-processor for processing robust data and generating a robust data packet of a certain format, a TS stream generator for combining the robust data packet and a normal data packet, and generating a TS stream of a certain format, a randomizer for randomizing the TS stream output from the TS stream generator, a convolutional encoder for performing convolutional encoding of the robust data of the data output from the randomizer, and an interleaver for interleaving the data output from the convolutional encoder.

Preferably, the transmitter may further include an RS encoder for performing RS encoding of the robust data output from the interleaver and normal data of the data output from the randomizer.

More preferably, the transmitter may further include a convolutional interleaver for interleaving the data output from the RS encoder.

Further, the transmitter may further include a trellis encoder for performing trellis encoding of the interleaved data by the convolutional interleaver after RS encoding.

Preferably, the convolutional encoder may perform convolutional encoding of the robust data in a certain method in order to improve coding gain when applied together with the tellis encoder.

Additionally, the interleaver may perform convolutional encoding of the robust data in a certain method in order to improve coding gain when both the convolutional encoder and the tellis encoder are applied together.

Further, the convolutional encoder may generate a certain parity for the robust data, and output the robust data and the parity.

Further, the convolutional encoder may puncture the parity in ½ rate.

Meanwhile, the convolutional encoder may skip the puncturing of the parity in ½ rate, and output the robust data and the parity as they are.

In addition, the trellis encoder may perform trellis encoding and output a mapping value of 4 level if the punctured parity is input.

Meanwhile, a signal processing method for a digital broadcasting transmitter according to the present invention may include generating a robust data packet of a certain format by processing robust data, combining the generated robust data packet and a normal data packet and generating a TS stream of a certain format, randomizing the TS stream, performing convolutional encoding of the robust data of the randomized data, and interleaving the convolutional-encoded data.

Meanwhile, a digital broadcasting receiver according to the present invention may includes a demodulator for receiving and demodulating a encoded signal inserted with robust data at a certain location, a robust location generator for detecting the location of the robust data from the demodulated signal, an equalizer for equalizing the demodulated signal, a turbo decoder for decoding the robust data of the signal output from the equalizer using the detected location of the robust data, a derandomizer for derandomizing the robust data output from the turbo decoder, and a robust data processor for processing and restructuring the robust data output from the derandomizer.

The turbo decoder may include a trellis decoder for trellis-decoding the robust data, and a convolutional decoder for convolutional-decoding the trellis-decoded robust data.

The trellis decoder and the convolutional decoder may exchange decoding reliability information each other upon decoding.

Additionally, the turbo decoder may further include an interleaver and a deinterleaver which connect the trellis decoder and the convolutional decoder respectively, and the reliability information may exchange each other through one path from the deinterleaver to the convolutional decoder and the other path from the interleaver to the trellis decoder.

Meanwhile, a signal processing method for a digital broadcasting receiver according to the present invention may include receiving and demodulating a encoded signal inserted with robust data at a certain location, detecting the location of the robust data from the demodulated signal, equalizing the demodulated signal, decoding the robust data of the equalized signal using the detected location of the robust data, derandomizing the decoded robust data, and processing and restructuring the derandomized robust data.

Advantageous Effects

According to the present invention, to improve a reception performance of the ATSC VSB method of a U.S-oriented terrestrial waves DTV system, a robust stream and a normal stream combine to generate an MPEG-2 packet, the MPEG-2 packet are encoded and transmitted, and a receiver detects the location of the robust stream and decodes the stream through information exchange using two extra decoders so that a reception performance of the robust stream can improve.

Therefore, the compatibility with the existing system is maintained and the reception performance in a poor channel environment improves.

BEST MODE FOR CARRYING OUT THE INVENTION

Figure 6:
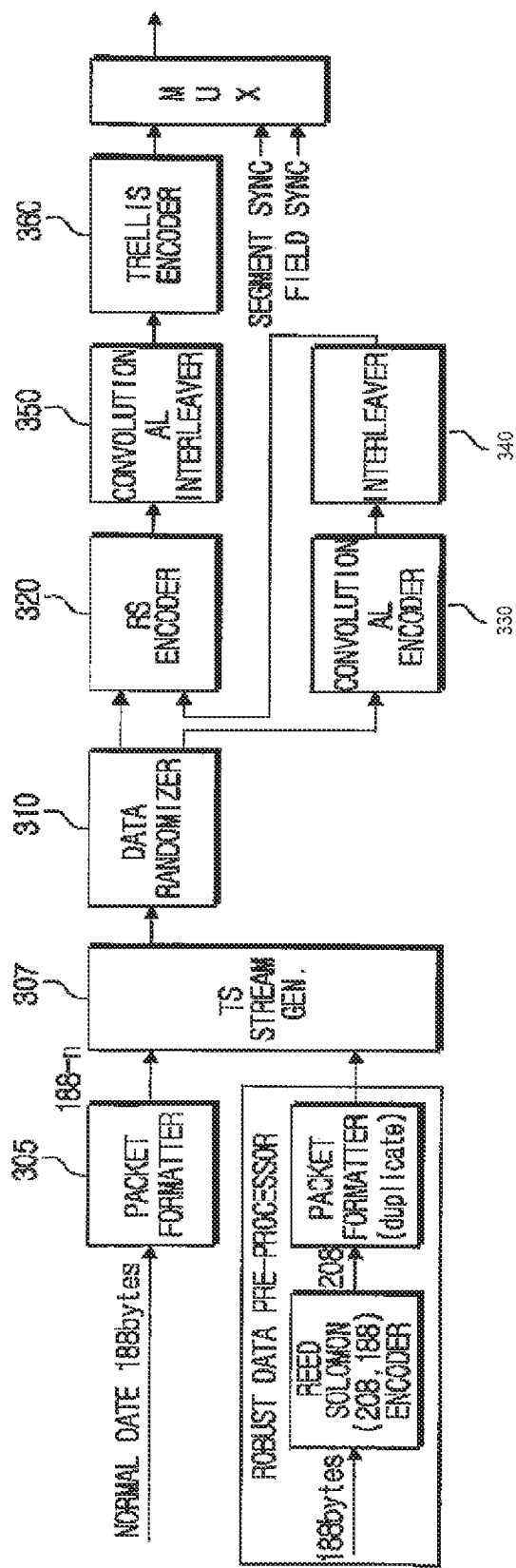
FIG. 6 is a view to show a digital broadcasting transmitter according to the present invention.

FIG. 6 is a block diagram to show a digital broadcasting transmitter of a dual stream EVBS system according to the present invention.

The digital broadcasting transmitter includes an RS encoder (301) and a first packet formatter (303) for preprocessing robust data to improve a reception performance of the robust data, a second packet formatter (305) for processing normal data, and a TS stream generator (307) for combining the robust data output from the first packet formatter (303) and the normal data output from the second packet formatter (305) to output an MPEG packet.

In addition, the digital broadcasting transmitter includes a randomizer (310) for randomizing the MPEG packet generated from the TS stream generator (307), a convolutional encoder (330) for encoding the robust stream part, an interleaver (340), an RS encoder (320) for encoding the robust stream output from the interleaver (340) and the normal stream together, a convolutional interleaver (350), and a trellis encoder (360).

In the digital broadcasting transmitter according to the present invention, the data output from the RS encoder (320) are input lo the trellis encoder (360) without alteration. Therefore, if the convolutional encoder (330) is employed ahead of the RS encoder (320), information exchange can be performed with the trellis encoder (360) using the data output from the RS encoder (320). That is, the transmitter can exchange information with the trellis encoder (360) using the convolutional-encoded robust stream so that a reception performance in a poor channel environment can be enhanced.

Figure 1:
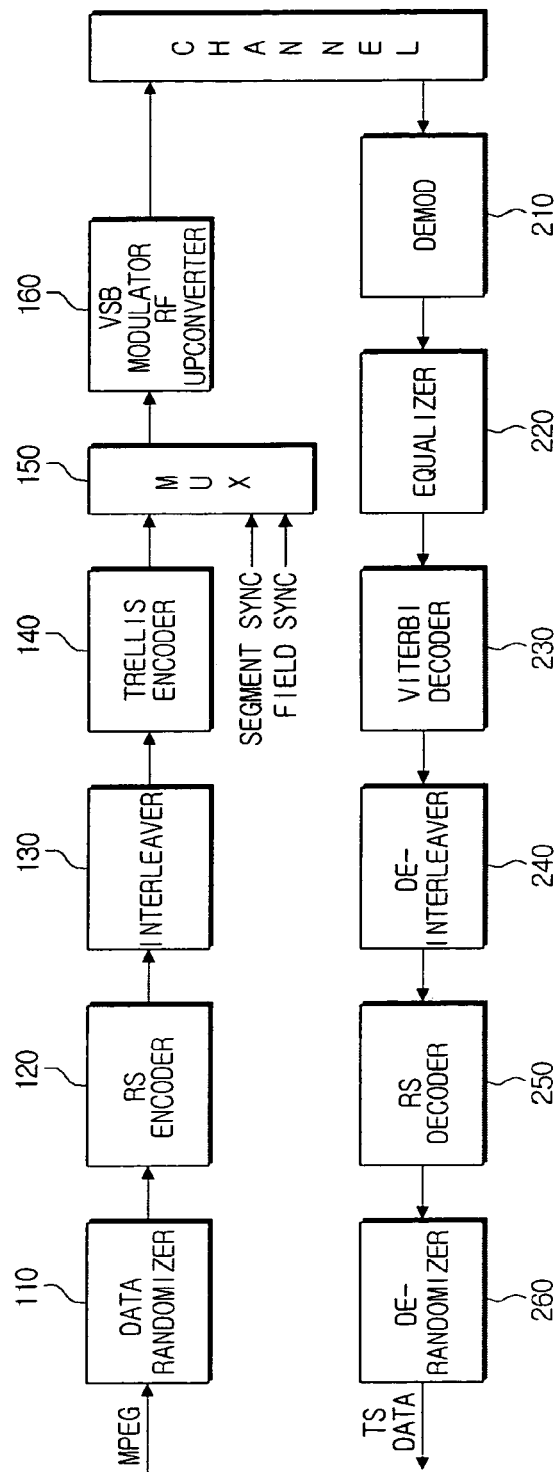
FIG. 1 is a block diagram to show a general digital broadcasting (ATSC VSB) transmission/reception system.
Figure 2:
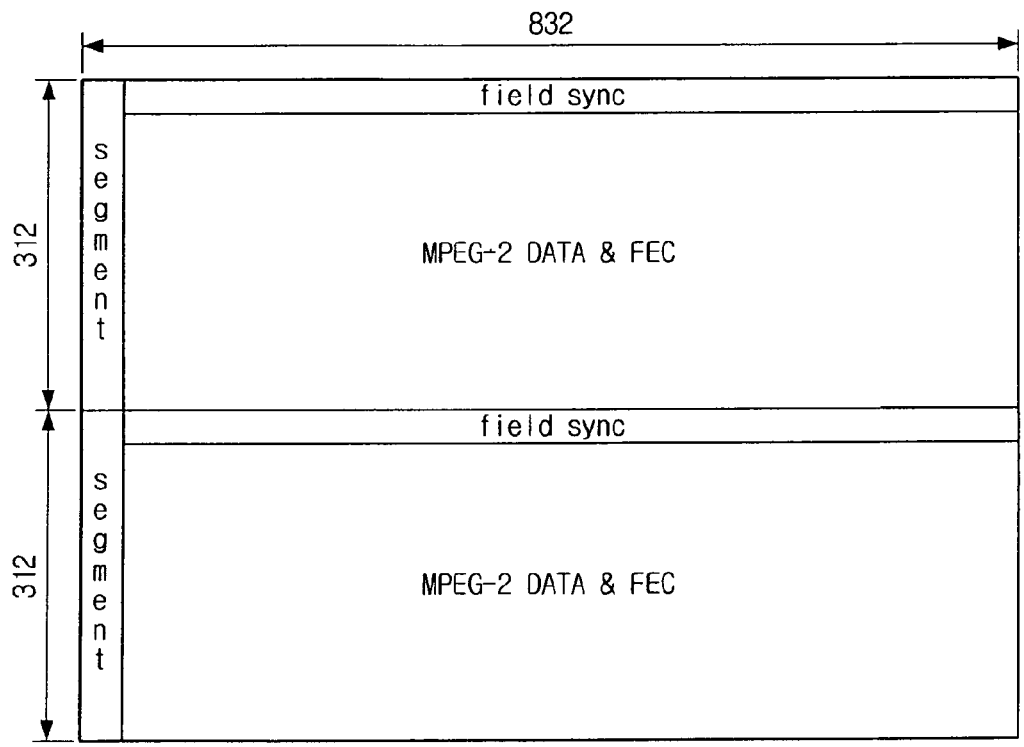
FIG. 2 is a view to show a frame structure of ATSC VSB data.
Figure 3:
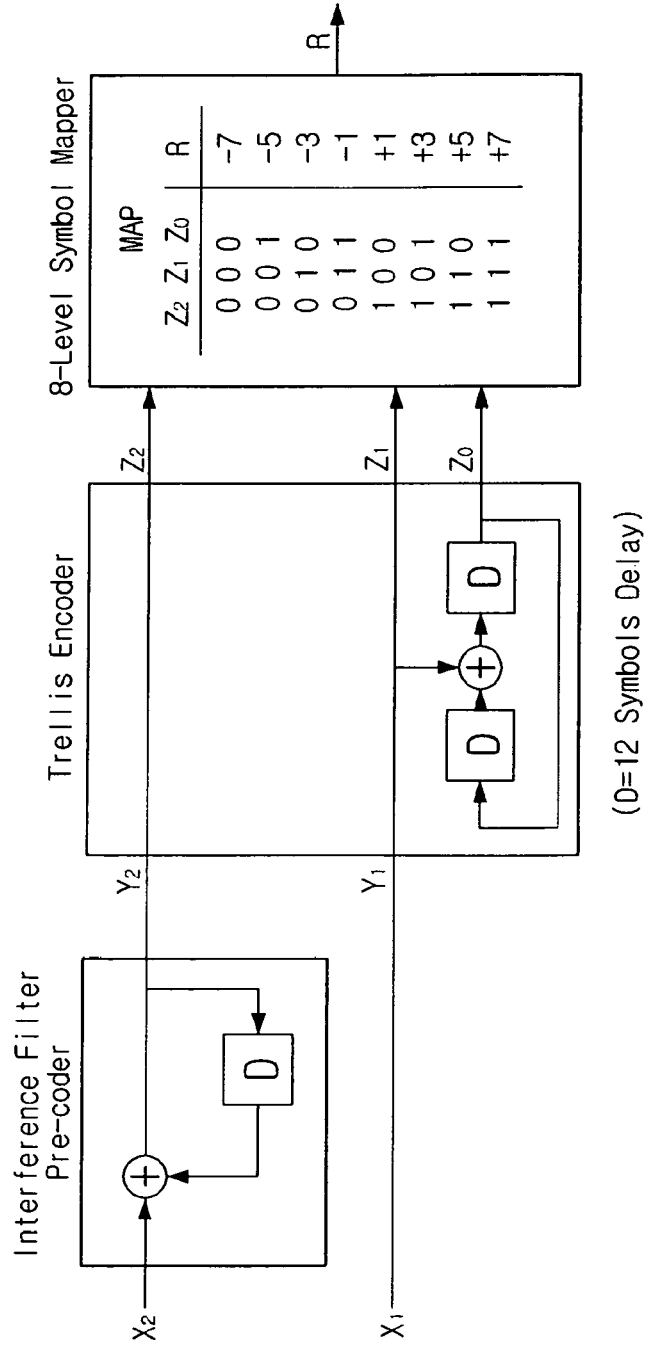
FIG. 3 is a view to show a structure of a trellis encoder.
Figure 4:
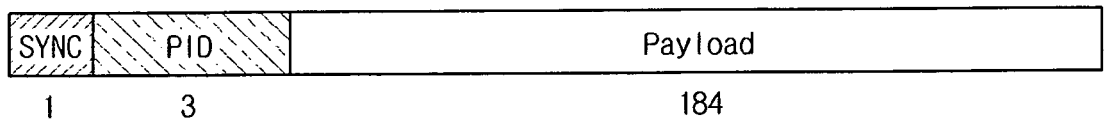
FIG. 4 is a view to show a structure of an MPEG packet generated from a digital broadcasting transmitter according to the present invention.
Figure 4:
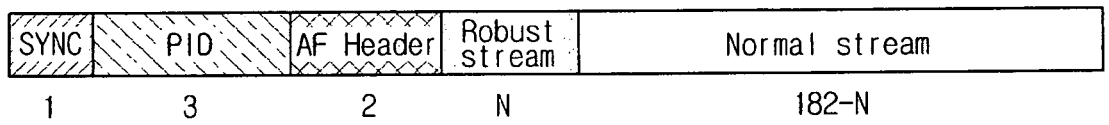

FIG. 4 shows a structure of an MPEG packet generated by the TS stream generator (307). The TS stream generator (307) restructures a new MPEG packet having both the input normal stream and robust stream. The robust stream is fixed in a particular location and transmitted, and an AF header can freely adjust the amount of the robust stream.

Figure 5:
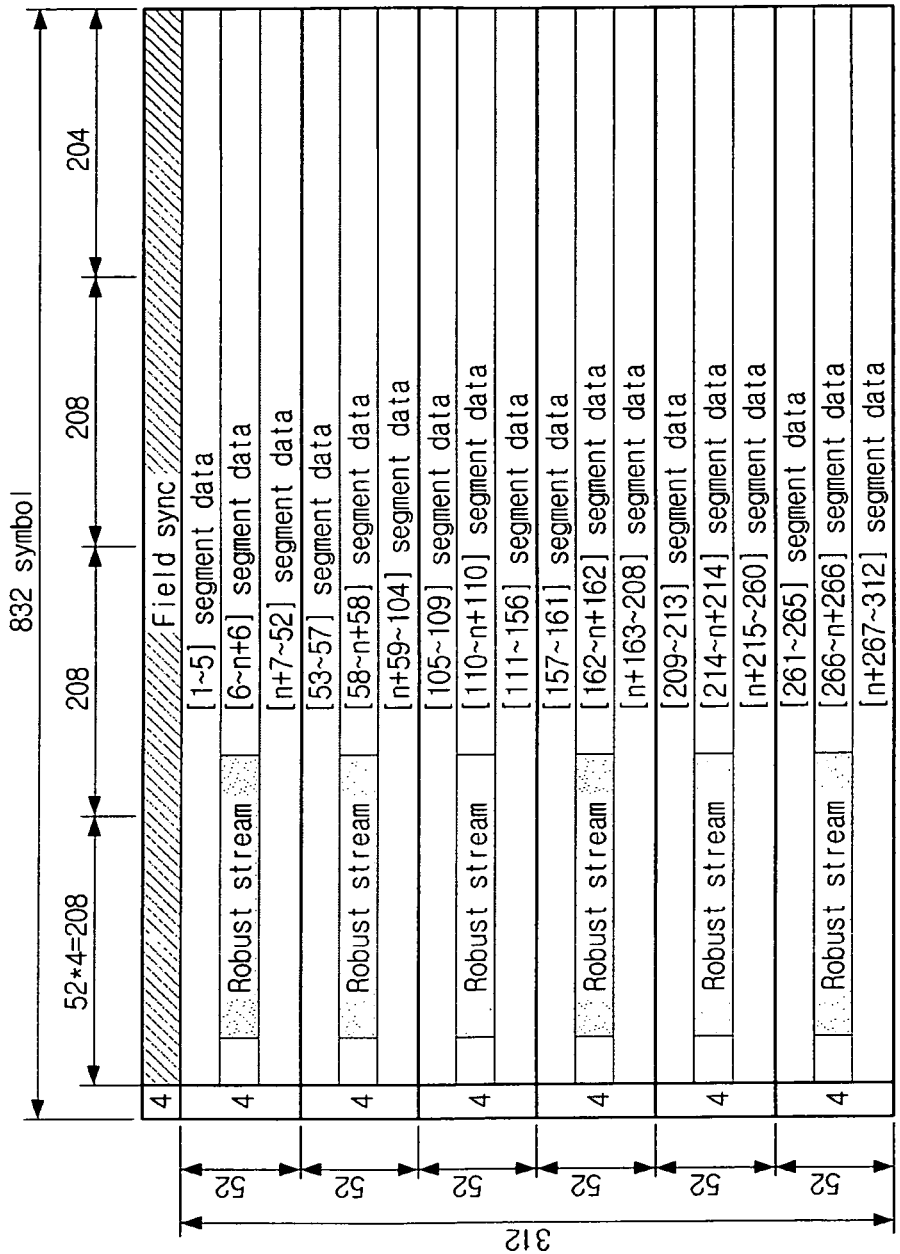
FIG. 5 is a view to show a data format output from a trellis encoder according to the present invention.

FIG. 5 shows a format of the data output from the trellis encoder (360). If the robust stream is transmitted using the particular location of an MPEG packet the robust stream passes through the convolutional encoder (330) and the interleaver (340), and successively gathered in the format of FIG. 5. Accordingly, maximum a posteriori probability (MAP)

decoding which operates by a frame unit can be simply performed for data of this format so that reception performance of a robust stream improves.

Figure 7:
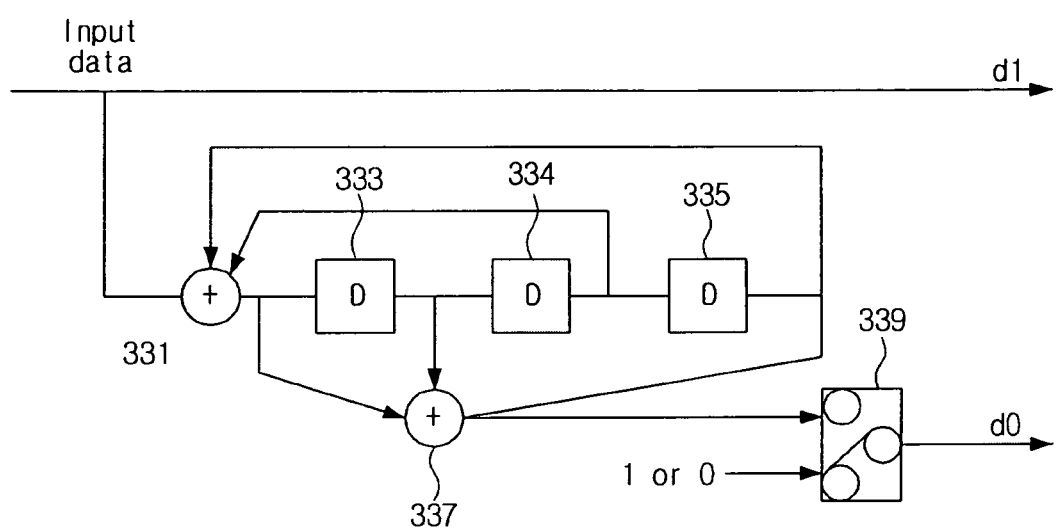
FIG. 7 is a view to show a structure of a convolutional encoder according to the present invention.

FIG. 7 shows a structure of a convolutional encoder according to the present invention. The structure of the convolutional encoder (330) can be implemented in various forms. Puncturing as shown in FIG. 7 can be used according to usage. Input of the systematic recursive convolutional is input as 'd1', which is input of an encoder differential encoder of the trellis encoder (360) and parity is input as in 'd0'. At this time, the parity can be output as it is or be punctured to include 1 or 0. The spot where '1' is inserted becomes 4VSB with '−3, −1, 5, 7' mapping value because 'd0' becomes Z1, and the spot where '0' is inserted becomes 4VSB with '−7, −5, 1, 3' mapping value. That is, output value becomes 8VSB or 4VSB alternately by puncturing and coding gain by the trellis encoder (360) is enhanced.

Figure 8:
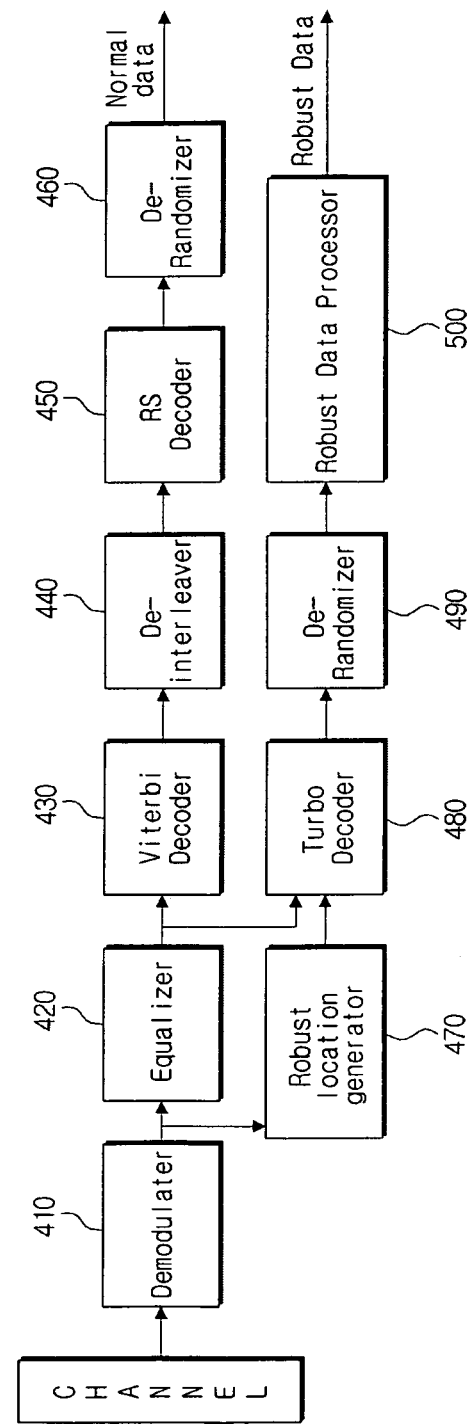
FIG. 8 is a view to show a structure of a digital broadcasting receiver according to the present invention.

FIG. 8 shows a structure of a digital broadcasting receiver according to the present invention. The receiver includes a demodulator (410) for demodulating a signal received through a channel, an equalizer (420) for compensating distortion by channel multipath, a Viterbi decoder (430) for correcting errors and performing decoding in symbol data, a deinterleaver (440) for rearranging the dispersed data of the decoded data, an RS decoder (450) for error-correcting the deinterleaved data, and a derandomizer (660) for derandomizing the error-corrected data. Normal data of the received signal are processed through the above structure.

Meanwhile, the receiver further includes a robust location generator (470) for detecting the location of robust data from the data stream demodulated through the demodulator (410), and a turbo decoder (480) for decoding the robust data using the detected location of the robust data.

The turbo decoder (480) includes two decoders of a trellis decoder (not shown) and a convolutional decoder (not shown), and enhances reception performance by exchanging decoding reliability information with each other. The output of the convolutional decoder are the same as the input of the RS encoder in the receiver.

Moreover, the turbo decoder (480) includes a deinterleaver (not shown) and an interleaver (not shown) therebetween to connect the trellis decoder and the convolutional decoder respectively. The interleaver (not shown) has a form that the interleaver (340) and the convolutional interleaver (350) of the transmitter are combined, performs interleaving of the two interleaver (340, 350), and becomes a path to deliver decoding reliability information from the trellis decoder to the convolutional decoder. Additionally, the deinterleaver (not shown) performs deinterleaving to reverse operation of the interleaver and becomes a path to deliver decoding reliability information from the convolutional decoder to the trellis decoder.

Subsequently, the output of the convolutional decoder of the turbo decoder (480) restructures the robust stream and is input to the robust data processor (500) for performing RS decoding.

According to the present invention, to improve reception performance of the VSB method of a U.S-oriented terrestrial waves DTV system, normal data and robust data are combined to become an MPEG-2 packet, a receiver detects the location of the robust data in the packet, and the robust data are decoded by information exchange between a trellis decoder and convolution decoder, so that reception performance of the robust data can be improved in a poor multipath channel environment.

Furthermore, the digital broadcasting transmission/reception method according to the present invention is compatible with the existing receiver that the ATSC suggested and is capable of improving the reception performance of the ATSC VSB method of a U.S-oriented terrestrial waves digital broadcasting system.

The invention claimed is:

1. A digital broadcasting receiver comprising:
    a decoder for decoding additional data comprised in a transport stream (TS) comprising normal data and the additional data; and
    an additional data processor for performing Reed-Solomon (RS) decoding on the decoded additional data,
    wherein the decoder includes a trellis decoder for trellis decoding the additional data, a deinterleaver for deinterleaving the additional data, a convolutional decoder for convolutional decoding the deinterleaved additional data without convolutional decoding the normal data, and an interleaver,
    wherein the additional data is RS-encoded and trellis encoded after being convolutional-encoded and interleaved in a digital broadcasting transmitter,
    wherein the additional data processor performs the RS decoding on the additional data that is trellis decoded, deinterleaved, convolutional decoded, and interleaved at the decoder, and
    wherein the trellis decoder and the convolutional decoder exchange decoding reliability information with each other.

2. The digital broadcasting receiver as claimed in claim 1, wherein the TS is generated by a transmitter inserting the additional data into an adaptation field of a normal data.

3. The digital broadcasting receiver as claimed in claim 2, wherein the TS comprises a header, an adaptation field header, an additional data area and a normal data area.

4. The digital broadcasting receiver as claimed in claim 1, wherein the additional data is repeated each predetermined number of segments.

5. The digital broadcasting receiver as claimed in claim 1, wherein the TS has been processed such that the TS has been RS encoded after the additional data among the normal data and the additional data is convolutional-encoded and interleaved.

6. The digital broadcasting receiver as claimed in claim 1, wherein the TS comprises the additional data and a normal data, and the additional data processor performs the RS decoding on the decoded additional data without performing the RS decoding on the normal data.

7. A digital broadcasting reception method comprising:
    decoding additional data comprised in a transport stream (TS) comprising normal data and the additional data; and
    performing Reed-Solomon (RS) decoding on the decoded additional data,
    wherein the decoding includes trellis decoding by a trellis decoder the additional data, deinterleaving the trellis decoded additional data, convolutional decoding by a convolutional decoder the deinterleaved additional data without convolutional decoding the normal data, and interleaving,
    wherein the additional data is RS-encoded and trellis encoded after being convolutional-encoded and interleaved in a digital broadcasting transmitter,
    wherein the RS decoding is performed on the additional data that is trellis decoded, deinterleaved, convolutional decoded, and interleaved at the decoding, and
    wherein the trellis decoder and the convolutional decoder exchange decoding reliability information with each other.

8. The method as claimed in claim 7, wherein the TS is generated by a transmitter inserting the additional data into an adaptation field of a normal data.

9. The method as claimed in claim 8, wherein the TS comprises a header, an adaptation field header, an additional data area and a normal data area.

10. The method as claimed in claim 7, wherein the additional data is repeated each predetermined number of segments.

11. The method of claim 7, wherein the TS has been processed such that the TS has been RS encoded after the additional data among the normal data and the additional data is convolutional-encoded and interleaved.

* * * * *